(12) United States Patent
Uemura (10) Patent No.: US 8,330,494 B2
(45) Date of Patent: Dec. 11, 2012

(54) SEMICONDUCTOR DEVICE HAVING A LATCH CIRCUIT

(75) Inventor: Taiki Uemura, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/072,931

(22) Filed: Mar. 28, 2011

(65) Prior Publication Data

US 2011/0309861 A1 Dec. 22, 2011

(30) Foreign Application Priority Data

Jun. 22, 2010 (JP) ................................. 2010-141987

(51) Int. Cl.
*H03K 19/00* (2006.01)
*H01L 25/00* (2006.01)

(52) U.S. Cl. .............................. 326/103; 326/122; 326/9

(58) Field of Classification Search ................ 326/9–10, 326/14–15, 21–28, 101–103
See application file for complete search history.

(56) References Cited

U.S. PATENT DOCUMENTS

2007/0063288 A1* 3/2007 Furuta et al. .................. 257/369
2010/0225356 A1* 9/2010 Uemura et al. ............... 326/121

FOREIGN PATENT DOCUMENTS

JP 2007-312104 A 11/2007

OTHER PUBLICATIONS

Amusan, Oluwole A. et al "Design Techniques to Reduce SET Pulse Widths in Deep-Submicron Combinational Logic," IEEE Transactions on Nuclear Science, Dec. 2007, vol. 54 No. 6, pp. 2060-2064 cited in spec.

* cited by examiner

*Primary Examiner* — Shawki Ismail
*Assistant Examiner* — Jany Tran
(74) *Attorney, Agent, or Firm* — Westerman, Hattori, Daniels & Adrian, LLP (57) ABSTRACT

A semiconductor device includes a first transistor included in a latch circuit, a second transistor that is included in the latch circuit and is formed in a well in which the first transistor is formed, the second transistor having a conduction type identical to that of the first transistor, and a well contact that is provided between the first transistor and the second transistor and connects a power supply to the well.

4 Claims, 7 Drawing Sheets

|         | Node11_n | Node12_n | Node21_n | Node22_n | Node11_p | Node12_p | Node21_p | Node22_p |
|---------|----------|----------|----------|----------|----------|----------|----------|----------|
| Node11_n |         | ERR      | NO       | NO       | NO       | NO       | NO       | ERR      |
| Node12_n | ERR      |          | NO       | NO       | NO       | NO       | ERR      | NO       |
| Node21_n | NO       | NO       |          | ERR      | ERR      | NO       | NO       | NO       |
| Node22_n | NO       | NO       | ERR      |          | NO       | ERR      | NO       | NO       |
| Node11_p | NO       | NO       | ERR      | NO       |          | ERR      | NO       | NO       |
| Node12_p | NO       | NO       | NO       | ERR      | ERR      |          | NO       | NO       |
| Node21_p | NO       | ERR      | NO       | NO       | NO       | NO       |          | ERR      |
| Node22_p | ERR      | NO       | NO       | NO       | NO       | NO       | ERR      |          |

SEMICONDUCTOR DEVICE HAVING A LATCH CIRCUIT

CROSS-REFERENCE TO RELATED APPLICATION

This application is based upon and claims the benefit of priority of the prior Japanese Patent Application No. 2010-141987, filed on Jun. 22, 2010, the entire contents of which are incorporated herein by reference.

FIELD

A certain aspect of the embodiments discussed herein is related to a semiconductor device.

BACKGROUND

Miniaturization of semiconductor devices results in coping with soft error in latch circuits. Soft error is a phenomenon in which the logic of data retained in the latch circuit is inverted due to the influence of a rays emitted from a radioactive substance in a semiconductor device and neutron derived from cosmic rays. Recently, there has been proposed a semiconductor device in which the configuration of the latch circuit is duplicated as a measure for coping with the soft error. According to this proposal, in case where the logical inversion takes place at one node in the latch circuit due to soft error, data retained in the latch circuit is retained correctly.

Another phenomenon is known in which noise occurs in one of a plurality of transistors formed in an identical well, noise occurs in any of the others. This phenomenon is caused by a mechanism in which a decrease in the well potential of one of the transistors due to the function of charged particles results in decreases of the well potentials of other transistors close to the above one of the transistors, and is called parasitic bipolar effect. It is known that a soft error due to the parasitic bipolar effect occurs more frequently as the distance between a well contact for applying a predetermined voltage to the well and the transistor formed in this well is longer.

The inventors are aware of Japanese Laid-Open Patent Publication No. 2007-312104, and Oluwole A. Amusan, et al., "Design Techniques to Reduce SET Pulse Widths in Deep-Submicron Combination Logic", IEEE TRANSACTIONS ON NUCLEAR SCIENCE, Vol. 54, No. 6, December 2007.

The duplicated latch circuit retains data correctly even when a logical inversion takes place at one node. However, if logical inversions occur simultaneously at two nodes due to the parasitic bipolar effect, the data retained in the latch circuit is inverted and data is destroyed.

SUMMARY

According to an aspect of the present invention, there is provided a semiconductor device comprising: a first transistor included in a latch circuit; a second transistor that is included in the latch circuit and is formed in a well in which the first transistor is formed, the second transistor having a conduction type identical to that of the first transistor; and a well contact that is provided between the first transistor and the second transistor and connects a power supply to the well.

DESCRIPTION OF EMBODIMENTS

A semiconductor device of a comparative example is now described.

Figure 1:
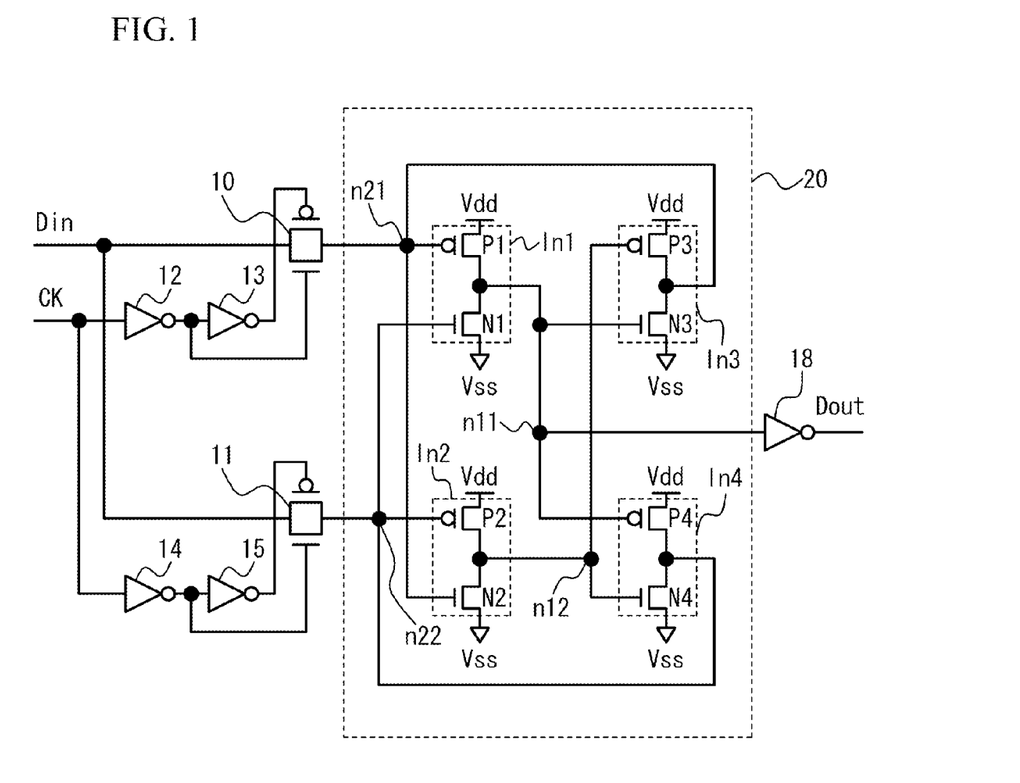
FIG. 1 is a circuit diagram of semiconductor devices in accordance with a comparative example and an embodiment.

FIG. 1 is a circuit diagram of semiconductor devices in accordance with a comparative example and an embodiment. An input signal Din separates into two signals, which are applied to a latch circuit 20 via path gates 10 and 11 driven by a clock signal CK. An output signal Dout is output from the latch circuit 20 via an inverter 18.

The clock signal CK separates into two signals, which are applied to the path gates 10 and 11. A pMOS transistor of the path gate 10 is supplied with the clock signal passing through inverters 12 and 13. An nMOS transistor of the path gate 10 is supplied with the clock signal passing through only the inverter 12. A pMOS transistor of the path gate 11 is supplied with the clock signal passing through inverters 14 and 15. An nMOS transistor of the path gate 11 is supplied with the clock signal passing through only the inverter 14.

The latch circuit 20 includes four CMOS inverters In1 through In4. Each of the CMOS inverters In1 through In4 includes one pMOS transistor (P1-P4) and one nMOS transistor (N1-N4), which transistors are connected in series between a first power supply Vdd and a second power supply Vss. Each of the CMOS inverters In1-In4 is output from an intermediate node between the pMOS transistor (P1-P4) and the nMOS transistor (N1-N4). The signal passing through the path gate 10 is applied to the gate of the pMOS transistor P1 of the CMOS inverter In1 and the gate of the nMOS transistor N2 of the CMOS inverter In2. A signal node n21 connects the gates of the pMOS transistor P1 and the nMOS transistor N2. Similarly, the signal passing through the path gate 11 is applied to the gate of the nMOS transistor N1 of the CMOS inverter In 1 and the gate of the pMOS transistor P2 of the CMOS inverter In2. A signal node n22 connects the gate of the nMOS transistor N1 and the gate of the pMOS transistor P2.

The output signal of the CMOS inverter In1 is applied to the gate of the nMOS transistor n3 of the CMOS inverter In3 and the gate of the pMOS transistor P4 of the CMOS inverter In4. A node n11 connects the gate of the nMOS transistor N3 and the gate of the pMOS transistor P4. Similarly, the output signal of the CMOS inverter In2 is applied to the gate of the pMOS transistor P3 of the CMOS inverter In3 and the gate of the nMOS transistor N4 of the CMOS inverter In4. A node n12 connects the gate of the pMOS transistor P3 and the gate of the nMOS transistor N4.

The output signal of the CMOS inverter In3 is fed back to the node n21, and the output signal of the CMOS inverter In4 is fed back to the node n22. The output terminal of the latch circuit 20 is connected to the node n11, and the signal level at the node n11 is the output of the latch circuit 20.

For example, when the nodes n21 and n22 are at the low level, the nodes n11 and n12 are at the high level, and the latch circuit 20 outputs the high-level signal. Assuming that the logic of the node n21 is inverted to the high level due to a soft error, the pMOS transistor P1 of the CMOS inverter In1 is turned OFF from ON, and the nMOS transistor N2 of the CMOS inverter In2 is turned ON from OFF. However, since the logic level of the node n22 that is complementary to the node n21 is retained at the low level, the nMOS transistor N1 of the CMOS inverter In1 is constantly OFF, and the pMOS transistor P2 of the CMOS inverter In2 is constantly ON. Thus, the outputs of the CMOS inverters In1 and In2 are maintained at the high level, and the output of the latch circuit 20 does not change. The low-level signal is fed back to the node n21 from the CMOS inverter In3, and the above soft error is corrected.

As described above, according to the semiconductor device of the comparative example, the latch circuit 20 is duplicated and the data retained in the latch circuit 20 is maintained correctly even when the logic of one node is inverted. However, as will be described below, when the logics at two nodes or more are inverted concurrently, the data retained in the latch circuit 20 may be inverted. This is described in detail below.

Figure 2:
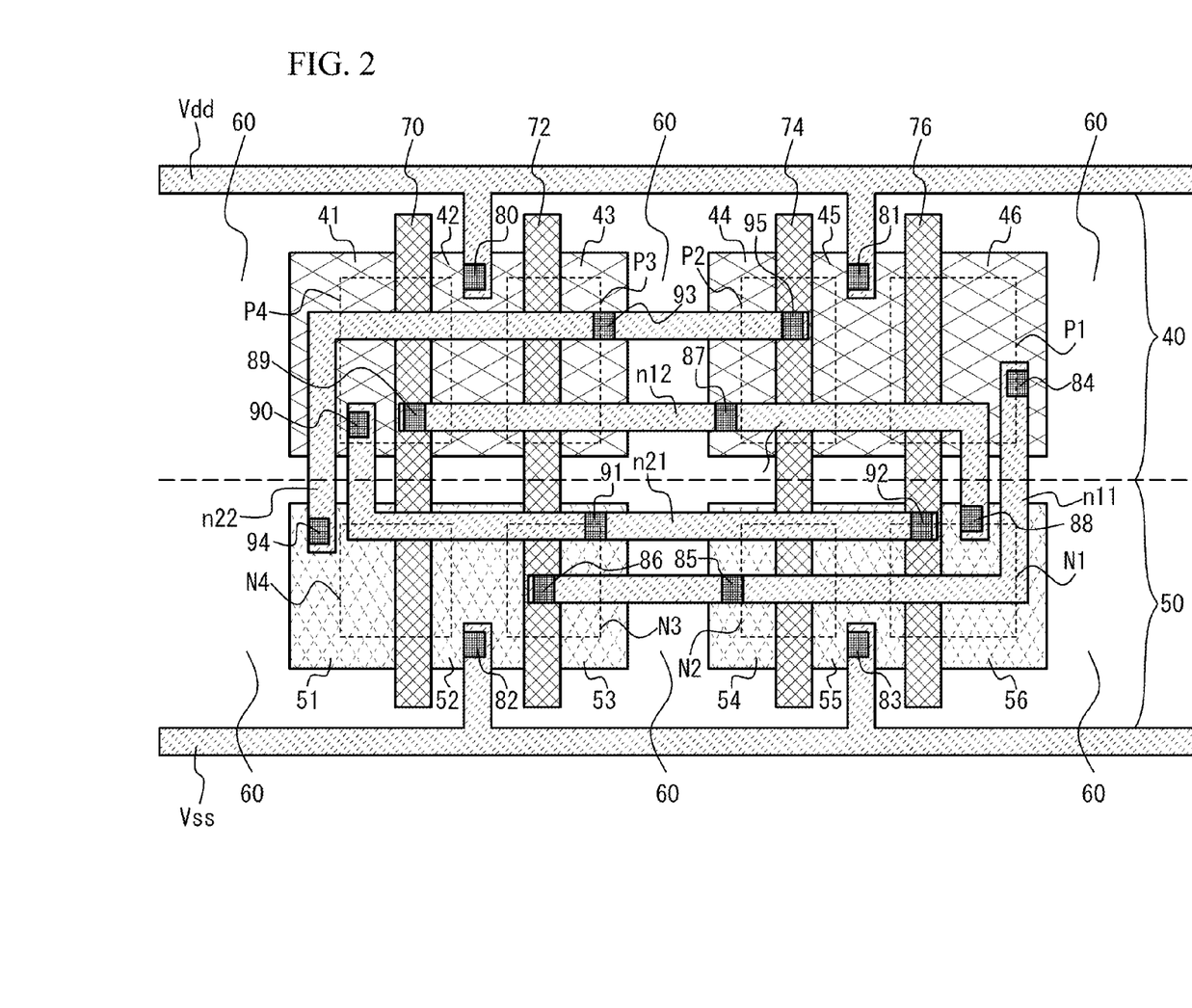
FIG. 2 is a plan view that illustrates a layout of a latch circuit of the semiconductor device of the comparative example.
Figure 3A:
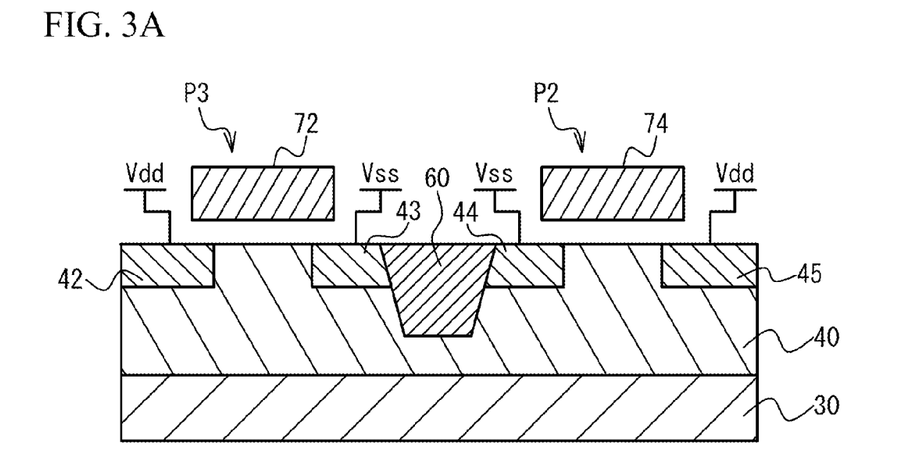
FIGS. 3A and 3B are cross-sectional views of the semiconductor device of the comparative example.

FIG. 2 is a plan view of a layout of the latch circuit of the semiconductor device of the comparative example. An n-type well 40 and a p-type well 50 are formed in a semiconductor substrate 30 (illustrated in FIG. 3). P-type diffusion layers 41 through 46 are formed in the n-type well 40, and n-type diffusion layers 51-56 are formed in the p-type well 50. The p-type diffusion layers 41 and 42 are separated from each other by a gate electrode 70, and the n-type diffusion layers 51 and 52 are separated from each other by the gate electrode 70. Similarly, the p-type diffusion layers 42 and 43 (n-type diffusion layers 52 and 53) are separated from each other by a gate electrode 72, and the p-type diffusion layers 44 and 45 (n-type diffusion layers 54 and 55) are separated from each other by a gate electrode 74. Similarly, the p-type diffusion layers 45 and 46 (n-type diffusion layers 55 and 56) are separated from each other by a gate electrode 76. The p-type diffusion layers 43 and 44 are separated from each other by an interlayer insulation film 60, and the n-type diffusion layers 53 and 54 are separated from each other by the interlayer insulation film 60.

A power supply line of the first power supply Vdd has a contact 80 with the p-type diffusion layer 42, and a contact 81 with the p-type diffusion layer 45. A power supply line of the second power supply Vss has a contact 82 with the p-type diffusion layer 52, and a contact 83 with the n-type diffusion layer 55. An interconnection n11 of the node n11 has a contact 84 with the p-type diffusion layer 46, a contact 85 with the n-type diffusion layer 54, and a contact 86 with the gate electrode 72. An interconnection n12 of the node n12 has a contact 87 with the p-type diffusion layer 44, a contact 88 with the n-type diffusion layer 56, and a contact 89 with the gate electrode 70. An interconnection n21 of the node n21 has a contact 90 with the p-type diffusion layer 41, a contact 91 with the n-type diffusion layer 53, and a contact 92 with the gate electrode 76. An interconnection n22 of the node n22 has a contact 93 with the p-type diffusion layer 43, a contact 94 with the n-type diffusion layer 51, and a contact 95 with the gate electrode 74.

The pMOS transistor P1 in FIG. 1 is composed of the p-type diffusion layer 45, the p-type diffusion layer 46 and the gate electrode 76. Similarly, the pMOS transistor P2 is composed of the p-type diffusion layer 44, the p-type diffusion layer 45 and the gate electrode 74, and the pMOS transistor P3 is composed of the p-type diffusion layer 42, the p-type diffusion layer 43 and the gate electrode 72. The pMOS transistor P4 is composed of the p-type diffusion layer 41, the p-type diffusion layer 42 and the gate electrode 70.

The nMOS transistor N1 in FIG. 1 is composed of the n-type diffusion layer 55, the n-type diffusion layer 56 and the gate electrode 76. Similarly, the nMOS transistor N2 is composed of the n-type diffusion layer 54, the n-type diffusion layer 55 and the gate electrode 74, and the nMOS transistor N3 is composed of the n-type diffusion layer 52, the n-type diffusion layer 53 and the gate electrode 72. The nMOS transistor N4 is composed of the n-type diffusion layer 51, the n-type diffusion layer 52 and the gate electrode 70.

FIG. 3A is a cross-sectional view of the semiconductor device of the comparative example, and illustrates structures of two pMOS transistors P2 and P3 separated from each other by the interlayer insulation film 60. Hereinafter, the two pMOS transistors P2 and P3 are referred to first transistor P2 and second transistor P3, respectively. The first transistor P2 and the second transistor P3 are formed in the common n-type well 40, which continuously extends below the interlayer insulation film 60. The first transistor P2 includes the drain diffusion layer 44, the source diffusion layer 45, and the gate electrode 74. The source diffusion layer 45 is connected to the first power supply Vdd, and the drain diffusion layer 44 is the second power supply Vss via an nMOS transistor (omitted for the sake of simplicity). Similarly, the second transistor P3 includes the drain diffusion layer 43, the source diffusion layer 42 and the gate electrode 72. The source diffusion layer 42 is connected to the first power supply Vdd, and the drain diffusion layer 43 is connected to the second power supply Vss via an nMOS transistor (omitted for the sake of simplicity).

Figure 3B:
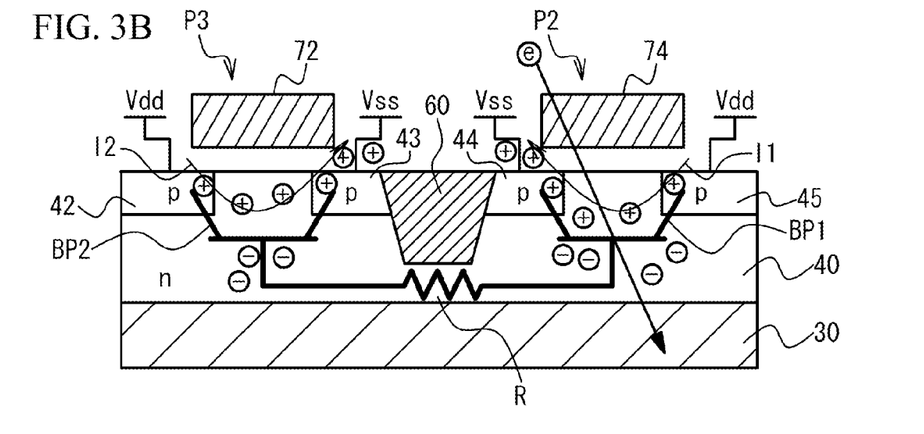

FIG. 3B is a diagram that describes a parasitic bipolar effect. A pnp-type parasitic bipolar transistor BP1 is formed by the drain diffusion layer 44, the source diffusion layer 45 and the n-type well 40 of the first transistor P2. When charged particles are incident to the first transistor P2, a negative charge generated in the n-type well 40 decreases the potential of the n-type well 40 in the vicinity of the source diffusion layer 45 and the drain diffusion layer 44. At this time, holes are supplied to the n-type well 40 from the source diffusion layer 45, and are further supplied to the drain diffusion layer 44 from the n-type well 40. That is, the parasitic bipolar transistor BP1 on the first transistor P2 side is turned ON, and a current I1 flows. Thus, a soft error that inverts the circuit logic is caused.

If the second transistor P3 is affected by the decrease in the potential of the n-type well 40 on the first transistor P2 side, the potential of the n-type well 40 on the second transistor P3 side is decreased. Thus, holes are supplied to the n-type well 40 from the source diffusion layer 42 of the second transistor P3, and are further to the drain diffusion layer 43 from the n-type well 40. That is, a parasitic bipolar transistor BP2 on the second transistor P3 side is turned ON, and a current flows. Thus, a soft error that inverts the circuit logic is caused.

As described above, in the two pMOS transistors formed in the common well, one of the two transistors receives the influence of a soft error that occurs in the other transistor, and the logics of two nodes may be concurrently inverted. This holds true for the nMOS transistors.

Figure 4:
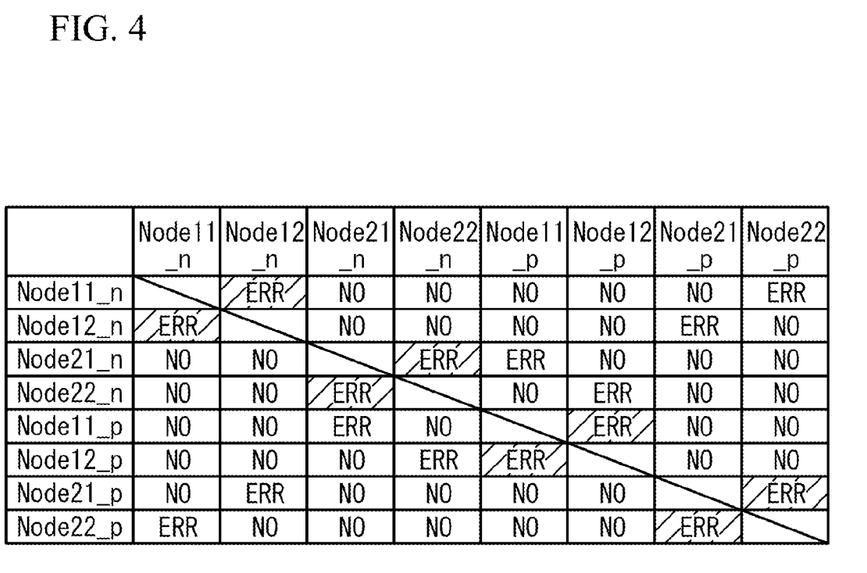
FIG. 4 illustrates a relationship between data inversion at each node in the latch circuit and the presence/absence of error in the output of the latch circuit.

FIG. 4 illustrates a relationship between data inversion at each node of the latch circuit 20 and the presence/absence of error in the output of the latch circuit 20. In FIG. 4, "ERR" denotes a combination of two nodes in which an error occurs when the logics of these nodes are concurrently inverted, and "NO" denotes a combination of two nodes in which an error does not occur when the logics of these nodes are concurrently inverted. A subscript added to each node ("Node" in FIG. 4) indicates the conduction type of the transistor (p-type or n-type).

As illustrated in FIG. 2, the pMOS transistors P1-P4 are formed in the same well, and the nMOS transistors N1-N4 are formed in the same well. Thus, there is a possibility that the logics of two nodes or more may be inverted concurrently. That is, among the combinations illustrated in FIG. 4, the following four combinations may have a concurrent error due to the above-described parasitic bipolar effect: (Node11_$n$, Node12_$n$), (Node21_$n$, Node22_$n$), (Node11_$p$, Node12_$p$), and (Node21_$p$, Node22_$p$). In case where the logics are concurrently inverted in any of the four combinations, the output of the whole latch circuit 20 is erroneous, and data is destroyed.

As described above, the semiconductor device of the comparative example has a possibility that the parasitic bipolar effect may cause the concurrent logic inversion and may invert the output of the duplicated latch circuit. According to an aspect of embodiments described below, destroy of data is suppressed.

First Embodiment

The circuit configuration of a semiconductor device in accordance with a first embodiment is similar to that of the comparative example (FIG. 1), and a description thereof is omitted here. In the following, a layout of the latch circuit 20 is described. Parts of the first embodiment that are the same as corresponding those of the comparative example (FIG. 2) are given the same reference numerals, and a description thereof is omitted here.

Figure 5:
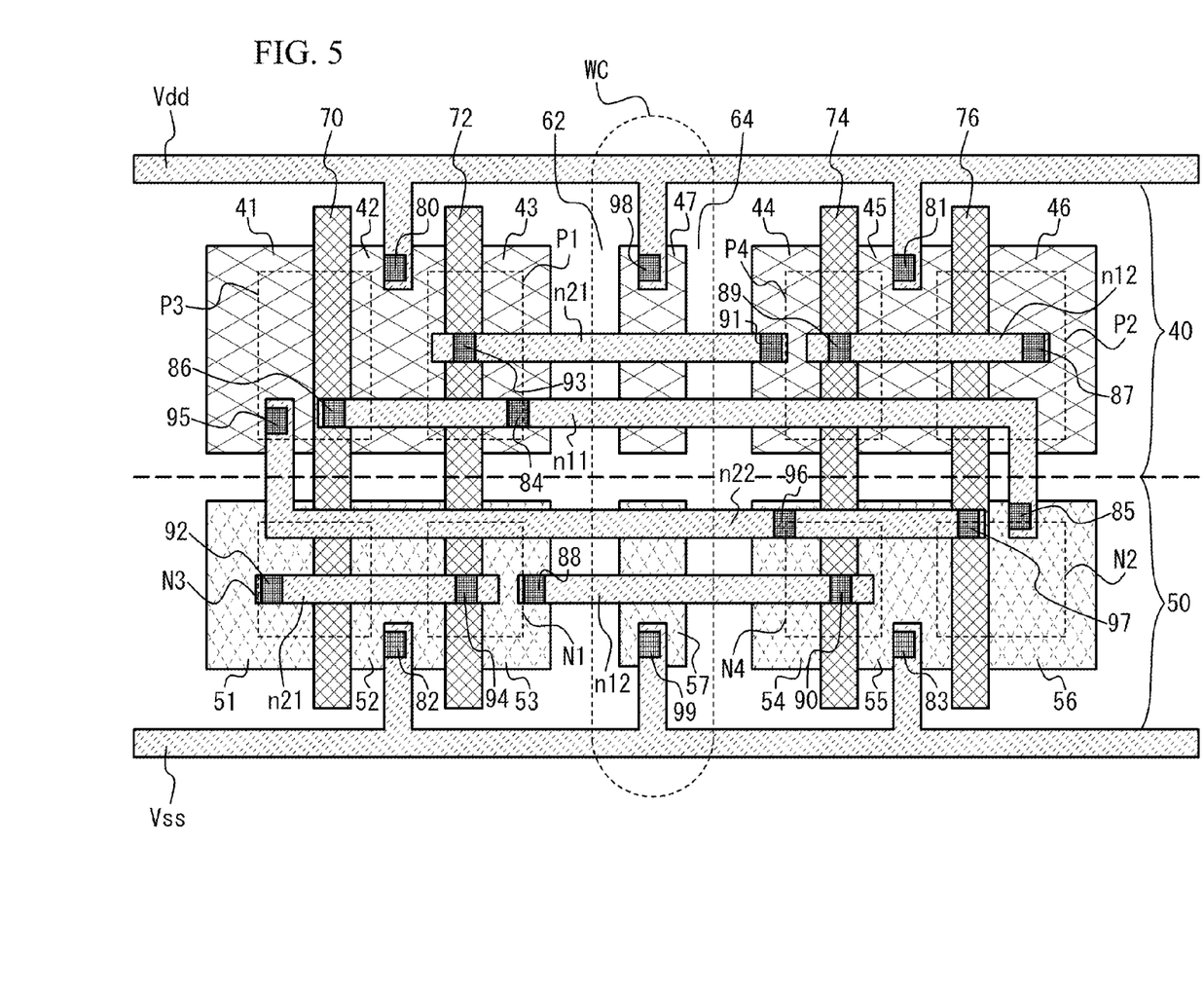
FIG. 5 is a plan view of a latch circuit of a semiconductor device in accordance with a first embodiment.

FIG. 5 is a plan view of a layout of a latch circuit of the semiconductor device according to the first embodiment. The n-type well 40 and the p-type well 50 are formed in the semiconductor substrate 30 (illustrated in FIGS. 6A and 6B). There are formed p-type diffusion layers 41 through 47 in the n-type well 40, and n-type diffusion layers 51 through 57 in the p-type well 50. The gate electrode 70 separates the p-type diffusion layers 41 and 42 from each other, and separates the n-type diffusion layers 51 and 52 from each other. Similarly, the gate electrode 72 separates the p-type diffusion layers 42 and 52 (n-type diffusion layers 52 and 53) from each other, and the gate electrode 74 separates the p-type diffusion layers 44 and 45 (n-type diffusion layers 54 and 55) from each other. The gate electrode 76 separates the p-type diffusion layers 45 and 46 (n-type diffusion layers 55 and 56) from each other.

The first embodiment differs from the comparative example in that the p-type diffusion layer 47 is formed between the p-type diffusion layer 43 and the p-type diffusion layer 44, and the n-type diffusion layer 57 is formed between the n-type diffusion layer 53 and the n-type diffusion layer 54. An interlayer insulation film 62 separates the p-type diffusion layers 43 and 47 from each other, and separates the n-type diffusion layers 53 and 57 from each other. An interlayer insulation film 64 separates the p-type diffusion layers 44 and 47 from each other, and separates the n-type diffusion layers 54 and 57 from each other. A region that includes the above-described newly added structures is called well contact WC, as illustrated in FIG. 5.

The power supply line of the first power supply Vdd has the contact 80 with the p-type diffusion layer 42, and the contact 81 with the p-type diffusion layer 45. The power supply line of the second power supply Vss has the contact 82 with the p-type diffusion layer 52, and the contact 83 with the n-type diffusion layer 55. The first embodiment differs from the comparative example in that the power supply line of the first power supply Vdd has a contact 98 with the p-type diffusion layer 47 in the well contact WC, and the power supply line of the second power supply Vss has a contact 99 with the n-type diffusion layer 57 in the well contact WC.

The interconnection n11 of the node n11 has the contact 84 with the p-type diffusion layer 43, the contact with the n-type diffusion layer 56, and the contact 86 with the gate electrode 70. The interconnection n12 of the node n12 has the contact 87 with the p-type diffusion layer 46, the contact 88 with the n-type diffusion layer 53, and the contacts 89 and 90 with the gate electrode 74. The interconnection n21 of the node n21 has the contact 91 with the p-type diffusion layer 44, the contact 92 with the n-type diffusion layer 51, and the contacts 93 and 94 with the gate electrode 72. The interconnection n22 of the node n22 has the contact 95 with the p-type diffusion layer 41, a contact 96 with the n-type diffusion layer 54 and a contact 97 with the gate electrode 76.

The pMOS transistor P1 in FIG. 5 is composed of the p-type diffusion layer 42, the p-type diffusion layer 43 and the gate electrode 72. Similarly, the pMOS transistor P2 is composed of the p-type diffusion layer 45, the p-type diffusion layer 46 and the gate electrode 76. The pMOS transistor P3 is composed of the p-type diffusion layer 41, the p-type diffusion layer 42 and the gate electrode 70. The pMOS transistor P4 is composed of the p-type diffusion layer 44, the p-type diffusion layer 45 and the gate electrode 74.

The nMOS transistor N1 in FIG. 5 is composed of the n-type diffusion layer 52, the n-type diffusion layer 53 and the gate electrode 72. Similarly, the nMOS transistor N2 is composed of the n-type diffusion layer 55, the n-type diffusion layer 56 and the gate electrode 76. The nMOS transistor N3 is composed of the n-type diffusion layer 51, the n-type diffusion layer 52 and the gate electrode 70. The nMOS transistor N4 is composed of the n-type diffusion layer 54, the n-type diffusion layer 55 and the gate electrode 74.

Figure 6A:
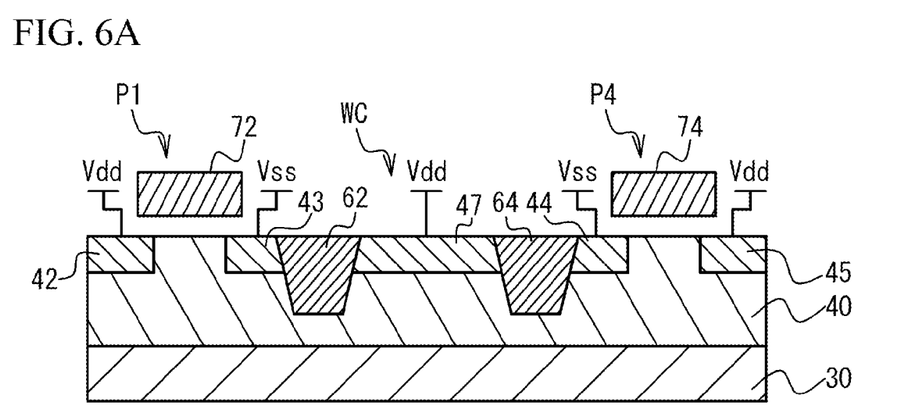
FIGS. 6A and 6B are cross-sectional view of the semiconductor device of the first embodiment.

FIG. 6A is a cross-sectional view of the semiconductor device in accordance with the first embodiment, and illustrates structures of two pMOS transistors P4 and P1 separated from each other by the interlayer insulation films 62 and 64. Hereinafter, the pMOS transistors P4 and P1 are referred to as first transistor P4 and second transistor P1, respectively. The first transistor P4 and the second transistor P1 are formed in the common n-type well 40, which continuously extends below the interlayer insulation films 62 and 64. The first embodiment differs from the comparative example in which the well contact WC is formed between the first transistor P4 and the second transistor P1.

The well contact WC connects the n-type well 40 to the predetermined power supply (the first power supply Vdd in the present embodiment) to apply the predetermined voltage to the n-type well 40 and maintains the potential of the n-type well 40 at the constant potential. The surface of the well contact WC is the p-type diffusion layer 47.

Figure 6B:
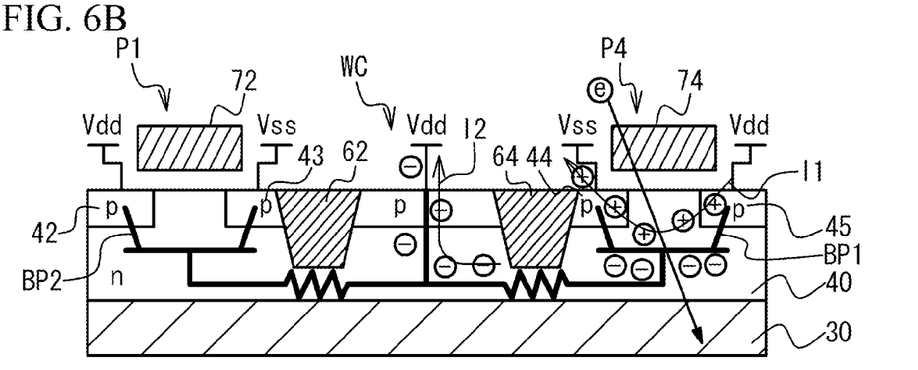

FIG. 6B describes the parasitic bipolar effect in the first embodiment. The pnp-type parasitic bipolar transistor BP 1 is formed by the drain diffusion layer 44, the source diffusion layer 45 and the n-type well 40 of the first transistor P4. When charged particles are incident to the first transistor P4, a negative charge generated in the n-type well 40 decreases the potential of the n-type well 40 in the vicinity of the source diffusion layer 45 and the drain diffusion layer 44. At this time, holes are supplied to the n-type well 40 from the source diffusion layer 45, and are further supplied to the drain diffusion layer 45 from the n-type well 40. That is, the parasitic bipolar transistor PB1 on the first transistor P4 side is turned ON and the current I1 flows. Thus, a soft error that inverts the circuit logic is caused.

In the first embodiment, the well contact WC is provided between the first transistor P4 and the second transistor P1. Thus, the negative charge (electrons) generated in the first transistor P4 flows to the well contact WC closer to the first transistor P4 than the second transistor P1, as indicated by an arrow I2 in FIG. 6B. This flow of the negative charge suppresses the decrease in the potential of the n-type well 40 on the second transistor P1 side, and makes it difficult to drive the parasitic bipolar transistor BP2 on the second transistor P1 side. By providing the well contact between the two transistors that share the well, it is possible to restrain one of the two transistors from being affected by a soft error that occurs in the other transistor. That is, it is possible to restrain the logics of two nodes or more in the latch circuit from being inverted concurrently and to suppress destroy of data due to the soft error.

Figure 7:
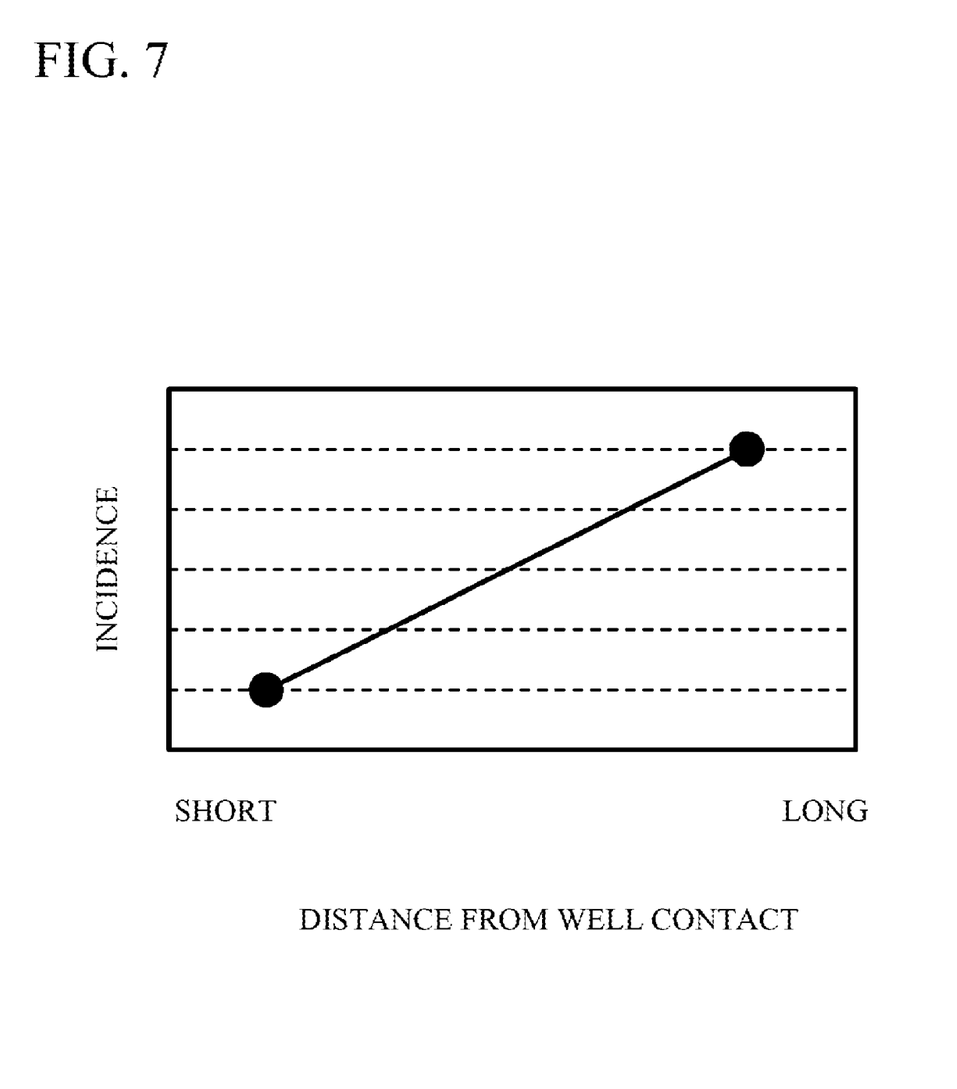
FIG. 7 is a graph that illustrates a relationship between the distance of a transistor from a well contact and the incidence of error.

FIG. 7 is a graph that illustrates a relationship between the distance of the transistor from the well contact and the incidence of error. As illustrated, as the distance between the well contact and the transistor becomes longer, the incidence of error becomes higher. It is considered that the relationship results from a fact such as the resistance between the transistor and the well contact increases as the distance increases. Thus, in order to suppress the occurrence of soft error in FIG. 6A, it is preferable to reduce the distance between the well contact WC and the transistors (the first transistor P4 and the second transistor P1).

According to the semiconductor device of the first embodiment, it is possible to restrain the logics of two nodes or more in the latch circuit from being inverted concurrently and to suppress destroy of data due to the soft error. The present configuration is particularly suitable for the duplicated latch circuit (which is configured to prevent the inversion of the logic of the data retained in the latch circuit even when the logic of one of multiple nodes in the circuit is inverted). It is to be noted that too many well contacts increase the device size. A minimum number of well contacts is preferably employed. In this case, the well contacts are preferably arranged between two nodes at which the data in the latch circuit may be destroyed due to a soft error (the logic of the data retained in the latch circuit is inverted when the logics at the two nodes are concurrently inverted).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A semiconductor device comprising:
   a first transistor included in a latch circuit;
   a second transistor that is included in the latch circuit and is formed in a well in which the first transistor is formed, the second transistor having a conduction type identical to that of the first transistor; and
   a well contact that is provided between the first transistor and the second transistor and connects a power supply to the well,
   wherein:
   the latch circuit has a first node and a second node;
   the first node and the second node have a relationship such that a logic of data retained in the latch circuit is inverted in a case where logics at the first node and the second node are inverted concurrently; and
   the first transistor is coupled to the first node, and the second transistor is coupled to the second node,
   wherein the well contact is provided only in a central part of the well, the central part being situated between the first node and the second node.

2. The semiconductor device according to claim 1, wherein a logic of data retained in the latch circuit is not inverted even in a case where one of nodes in the latch circuit has a logical inversion.

3. The semiconductor device according to claim 1, wherein the latch circuit includes multiple CMOS inverters and feed back paths by which an input is fed back to said input via the multiple CMOS inverters.

4. The semiconductor device according to claim 3, wherein the CMOS inverters include a first group and a second group, the first group including at least two inverters configured to output data obtained by inverting the input, the second group including at least two inverters configured to output data identical to the input.

* * * * *